US010097137B2

(12) United States Patent
Watkins et al.

(10) Patent No.: US 10,097,137 B2
(45) Date of Patent: Oct. 9, 2018

(54) TIMING ALIGNMENT SENSITIVITY FOR ENVELOPE TRACKING

(71) Applicant: KABUSHIKI KAISHA TOSHIBA, Tokyo (JP)

(72) Inventors: Gavin Watkins, Bristol (GB); Konstantinos Mimis, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/124,741

(22) PCT Filed: Aug. 29, 2014

(86) PCT No.: PCT/GB2014/052636
§ 371 (c)(1),
(2) Date: Sep. 9, 2016

(87) PCT Pub. No.: WO2016/030651
PCT Pub. Date: Mar. 3, 2016

(65) Prior Publication Data
US 2017/0170791 A1     Jun. 15, 2017

(51) Int. Cl.
*H03D 3/18* (2006.01)
*H03F 1/26* (2006.01)
(Continued)

(52) U.S. Cl.
CPC .......... *H03F 1/0222* (2013.01); *H03F 3/189* (2013.01); *H03F 3/24* (2013.01); *H03F 3/68* (2013.01);
(Continued)

(58) Field of Classification Search
CPC ...... H03F 3/189; H03F 2200/451; H03F 3/24; H03F 3/20; H03F 2200/336;
(Continued)

(56) References Cited

U.S. PATENT DOCUMENTS

| 5,142,240 A | 8/1992 | Isota et al. |
| 8,907,728 B2 | 12/2014 | Watkins |

(Continued)

FOREIGN PATENT DOCUMENTS

| GB | 2484475 A | 4/2012 |
| GB | 2489440 A | 10/2012 |

(Continued)

OTHER PUBLICATIONS

International Preliminary Report on Patentability and Written Opinion issued by The International Bureau of WIPO, dated Mar. 9, 2017, for International Appl. No. PCT/GB2014/052636.

(Continued)

*Primary Examiner* — Sam K Ahn
*Assistant Examiner* — Sarah Hassan
(74) *Attorney, Agent, or Firm* — Finnegan, Henderson, Farabow, Garrett & Dunner, L.L.P.

(57) ABSTRACT

In one embodiment a transmitter is disclosed. The transmitter comprises an envelope tracking amplifier circuit comprising a power amplifier; a radiofrequency path configured to couple a radiofrequency component of an input signal to an input of the power amplifier; an envelope path configured to modulate a supply voltage of the power amplifier with an envelope signal, the envelope path comprising an envelope shaping module configured to shape an envelope of the input signal using an envelope shaping function to obtain the envelope signal; and a delay block configured to vary the relative timing alignment of the radiofrequency path and the envelope path; storage for an indication of the envelope shaping function to be used by the envelope shaping module; and a processor operable to, iteratively search for a value of a first parameter of a generic envelope shaping function, by applying a test signal to the envelope tracking amplifier circuit and controlling the delay block over a (Continued)

sweep of the relative timing alignments between the radiofrequency path and the envelope path; determining an average measure of distortion of output of the envelope tracking amplifier circuit for the sweep of relative timing alignments; comparing the average measure of distortion of output of the envelope tracking amplifier circuit with an average measure of distortion of the output of the envelope tracking amplifier circuit for a previous iteration; and selecting for the envelope shaping function the value of the first parameter from the previous iteration if the average measure of distortion of the output of the envelope tracking amplifier circuit for the previous iteration is lower than the average measure of distortion of the output of the envelope tracking amplifier circuit determined; and storing an indication of the envelope shaping function with the selected value for the first parameter in the storage.

8 Claims, 6 Drawing Sheets

(51) Int. Cl.
| | |
|---|---|
| *H03F 1/02* | (2006.01) |
| *H03F 3/68* | (2006.01) |
| *H03F 3/189* | (2006.01) |
| *H03F 3/24* | (2006.01) |
| *H04B 1/10* | (2006.01) |
| *H04L 25/03* | (2006.01) |
| *H04B 1/04* | (2006.01) |

(52) U.S. Cl.
CPC ..... *H04B 1/1027* (2013.01); *H04L 25/03343* (2013.01); *H03F 2200/102* (2013.01); *H04B 2001/0408* (2013.01); *H04B 2001/0416* (2013.01)

(58) Field of Classification Search
CPC .... H03F 2200/294; H03F 1/3241; H03F 3/68; H03F 2200/411; H03F 2200/423; H03F 3/181

USPC .......................................... 375/328; 330/149
See application file for complete search history.

(56) References Cited

U.S. PATENT DOCUMENTS

| | | | |
|---|---|---|---|
| 9,131,510 B2 | 9/2015 | Wang | |
| 9,787,100 B2 | 10/2017 | Watkins | |
| 2007/0018718 A1* | 1/2007 | Horng | ................... H03F 1/0227 330/10 |
| 2010/0157464 A1* | 6/2010 | Mathew | ........... G11B 20/10194 360/75 |
| 2012/0326777 A1 | 12/2012 | Onishi | |
| 2013/0200949 A1 | 8/2013 | Wilson | |
| 2014/0218108 A1 | 8/2014 | Brice | |
| 2015/0123735 A1* | 5/2015 | Wimpenny | ............. H03F 3/211 330/295 |
| 2016/0013759 A1 | 1/2016 | Watkins | |
| 2016/0226449 A1 | 8/2016 | Watkins | |

FOREIGN PATENT DOCUMENTS

| | | |
|---|---|---|
| JP | H 03-198512 A | 8/1991 |
| JP | 2004-356835 A | 12/2004 |
| WO | WO 2011/125261 A1 | 10/2011 |
| WO | WO 2015/145097 A1 | 10/2015 |

OTHER PUBLICATIONS

Kim, Jungjoon, et al., "Optimization of Envelope Tracking Power Amplifier for Base-Station Applications," *IEEE Transactions on Microwave Theory & Techniques*, vol. 61, No. 4 (Apr. 2013), pp. 1620-1627.

"Envelope Tracking in Next Generation Military Radios," available at http://www.microwavejournal.com/articles/20316-envelope-tracking-in-next-generation-military-radios?v=preview, accessed on Aug. 19, 2014 (8 pages).

* cited by examiner

TIMING ALIGNMENT SENSITIVITY FOR ENVELOPE TRACKING

FIELD

Embodiments described herein relate generally to envelope shaping and envelope tracking in radiofrequency power amplifiers.

BACKGROUND

Envelope tracking (ET) is a viable contender for next generation high efficiency radiofrequency (RF) power amplifiers (PA). One major challenge with ET is the timing alignment between the RF and envelope paths. Inaccurate alignment generates distortion which manifests itself as a degradation in the adjacent channel power ratio (ACPR) and error vector magnitude (EVM).

Complex calibration routines and hardware have been proposed to overcome this. This is acceptable in a high power transmitter, but for low power applications the excess power consumption and cost is a significant overhead.

BRIEF DESCRIPTION OF THE DRAWINGS

Embodiments will be described as non-limiting examples with reference to the accompanying drawings in which.

DETAILED DESCRIPTION

In one embodiment a transmitter is disclosed. The transmitter comprises an envelope tracking amplifier circuit comprising a power amplifier; a radiofrequency path configured to couple a radiofrequency component of an input signal to an input of the power amplifier; an envelope path configured to modulate a supply voltage of the power amplifier with an envelope signal, the envelope path comprising an envelope shaping module configured to shape an envelope of the input signal using an envelope shaping function to obtain the envelope signal; and a delay block configured to vary the relative timing alignment of the radiofrequency path and the envelope path; storage for an indication of the envelope shaping function to be used by the envelope shaping module; and a processor operable to, iteratively search for a value of a first parameter of a generic envelope shaping function, by applying a test signal to the envelope tracking amplifier circuit and controlling the delay block over a sweep of the relative timing alignments between the radiofrequency path and the envelope path; determining an average measure of distortion of output of the envelope tracking amplifier circuit for the sweep of relative timing alignments; comparing the average measure of distortion of output of the envelope tracking amplifier circuit with an average measure of distortion of the output of the envelope tracking amplifier circuit for a previous iteration; and selecting for the envelope shaping function the value of the first parameter from the previous iteration if the average measure of distortion of the output of the envelope tracking amplifier circuit for the previous iteration is lower than the average measure of distortion of the output of the envelope tracking amplifier circuit determined; and storing an indication of the envelope shaping function with the selected value for the first parameter in the storage.

In an embodiment the processor is further operable to determine an optimum timing alignment between the radiofrequency path and the envelope path and to store the optimum timing alignment in the memory.

In an embodiment the measure of distortion is an adjacent channel power ratio.

In an embodiment the processor is further operable to optimise the value of a second parameter.

In an embodiment the processor is further operable to select the envelope shaping function based on efficiency and/or linearity.

In an embodiment a method of optimising an envelope shaping function for an envelope tracking amplifier circuit is disclosed. The envelope tracking amplifier circuit comprises a power amplifier; a radiofrequency path configured to couple a radiofrequency component of an input signal to an input of the power amplifier; an envelope path comprising an envelope shaping module configured to shape an envelope signal of the input signal according to the envelope shaping function, the envelope path being configured to modify a supply voltage of the power amplifier depending on the shaped envelope signal, and a delay block configured to vary the relative timing alignment of the radiofrequency path and the envelope path. The method comprises iteratively searching for a value of a first parameter of a generic envelope shaping function, by applying a test signal to the envelope tracking amplifier circuit and controlling the delay block over a sweep of the relative timing alignments between the radiofrequency path and the envelope path; determining an average measure of distortion of output of the envelope tracking amplifier circuit for the sweep of relative timing alignments; comparing the average measure of distortion of output of the envelope tracking amplifier circuit with an average measure of distortion of the output of the envelope tracking amplifier circuit for a previous iteration; and selecting for the envelope shaping function the value of the first parameter from the previous iteration if the average measure of distortion of the output of the envelope tracking amplifier circuit for the previous iteration is lower than the determined average measure of distortion of the output of the envelope tracking amplifier circuit.

In an embodiment the method further comprises determining an optimum timing alignment between the radiofrequency path and the envelope path and to store the optimum timing alignment in the memory.

In an embodiment the measure of distortion is an adjacent channel power ratio.

In an embodiment the method further comprises optimising the value of a second parameter.

In an embodiment the method further comprises selecting the envelope shaping function based on efficiency and/or linearity.

Figures 1A, 1B:
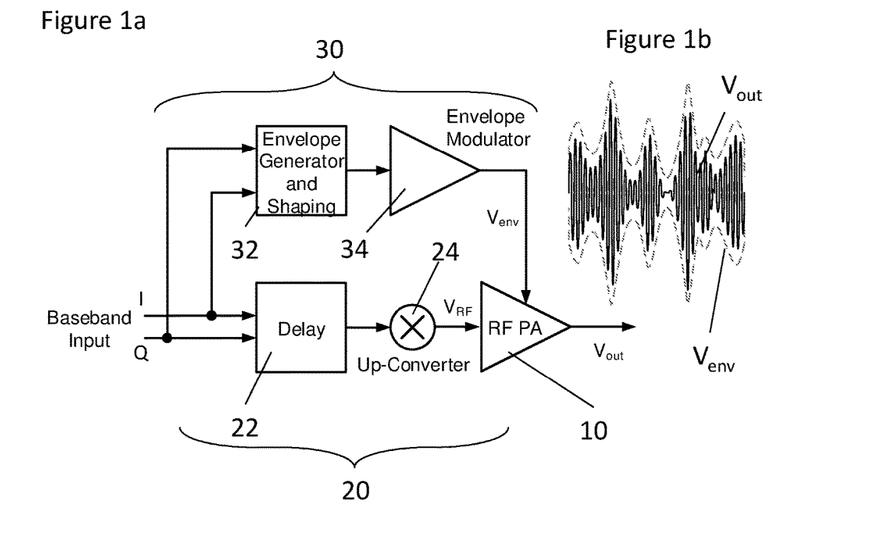
FIG. 1a shows an envelope tracking transmitter according to an embodiment.
FIG. 1b shows an output signal and an envelope signal of an envelope tracking transmitter according to an embodiment.

FIG. 1a shows an envelope tracking transmitter according to an embodiment. The circuit shown in FIG. 1a amplifies a baseband input signal having an in-phase component I and a quadrature component Q. The circuit comprises a power amplifier 10. The circuit comprises a radiofrequency (RF) path 20 and an envelope path 30. The RF path 20 comprises a delay block 22 and an up-converter 24. A radiofrequency component $V_{RF}$ of the input signal is coupled to an input of the power amplifier 10 by the RF path 20. The envelope path 30 comprises an envelope generator and shaping module 32 and an envelope modulator 34. The envelope generator and shaping module 32 generates an envelope signal using an envelope shaping function. The envelope modulator 34 modulates the supply voltage of the power amplifier 10 with an envelope signal $V_{env}$. A closed-loop architecture is used whereby part of the output RF signal ($V_{out}$) is sampled, and fed back to the baseband.

FIG. 1b shows the output signal $V_{out}$ and the envelope signal $V_{env}$ when aligned in time. Timing misalignment in ET transmitters is a major issue. Timing alignment between the RF and envelope paths is adjusted in the digital baseband while the output monitored via the feedback signal. Maximum fidelity (i.e. minimum distortion) is achieved at the optimum timing alignment between the RF ($V_{RF}$) and envelope ($V_{env}$) signals.

The impact of timing alignment is shown in FIGS. 2a to 2c. FIG. 2a shows the output signal $V_{out}$ and envelope signal $V_{env}$ when the RF ($V_{RF}$) and envelope ($V_{env}$) signals are aligned in time. As shown in FIG. 2a, when the RF and envelope signals are aligned in time there is no distortion of the output signal. FIG. 2b shows the output signal and envelope signal when the envelope signal lags behind the RF signal. As shown in FIG. 2b, the output signal is distorted because the supply voltage to the power amplifier limits the maximum output voltage to a value lower than the required output at certain points which are shown as dotted lines in FIG. 2b. FIG. 2c shows the output signal and envelope signal when the envelope signal leads the RF signal. As shown in FIG. 2c, the output signal is distorted when the supply voltage to the power amplifier is not high enough to give the required output voltage.

In embodiments, an envelope shaping (ES) function is used to shape the envelope voltage supplied to the drain of the RF amplifier. This reduces the timing alignment sensitivity, which in turn reduces distortion. The Adjacent Channel Power Ratio (ACPR) is a measure of distortion. ES is also used in embodiments for improving efficiency.

The sensitivity to timing alignment is considered when selecting the ES function. Timing alignment sensitivity is important, since the delay offset between the paths can vary with: frequency, temperature and component tolerance. Embodiments described herein provide a simple solution to a complex problem. Thus a cost saving is possible along with improved reliability.

Figure 3:
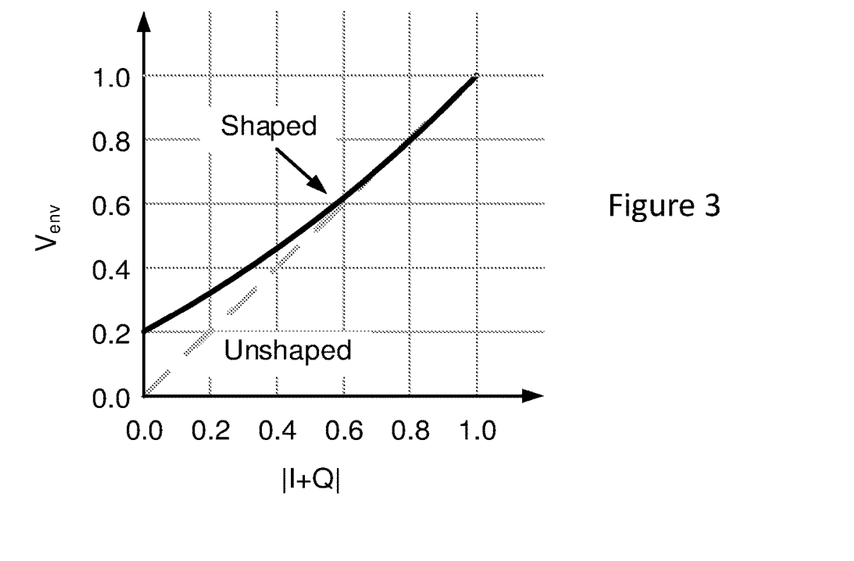
FIG. 3 shows the form of Envelope shaping which is applied in an embodiment.

FIG. 3 shows the form of Envelope shaping which is applied in an embodiment. Envelope shaping of the form shown in FIG. 3 is applied to $V_{env}$. The input is the magnitude of the baseband input signal, |I+Q|. This is mathematically manipulated, so that $V_{env}$ has the same peak value as |I+Q|, but a greater minimum value as shown in FIG. 3. In addition to reducing senility to timing alignment, the ES function may also be optimised for maximising linearity and efficiency.

Figure 2:
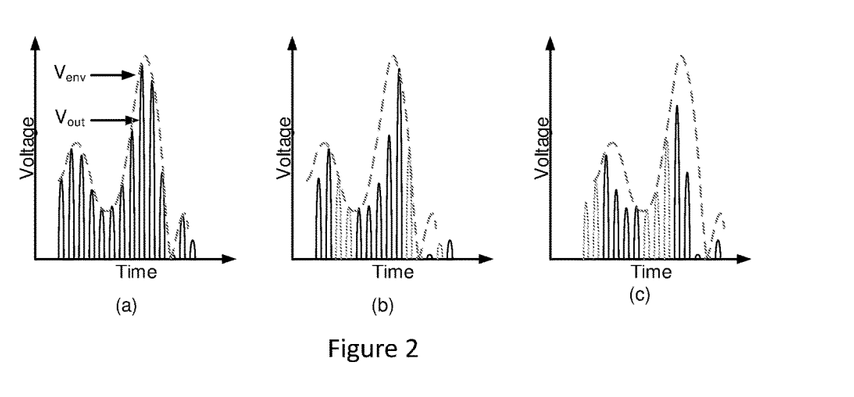
FIGS. 2a to 2c show the impact of timing alignment.
Figure 4:
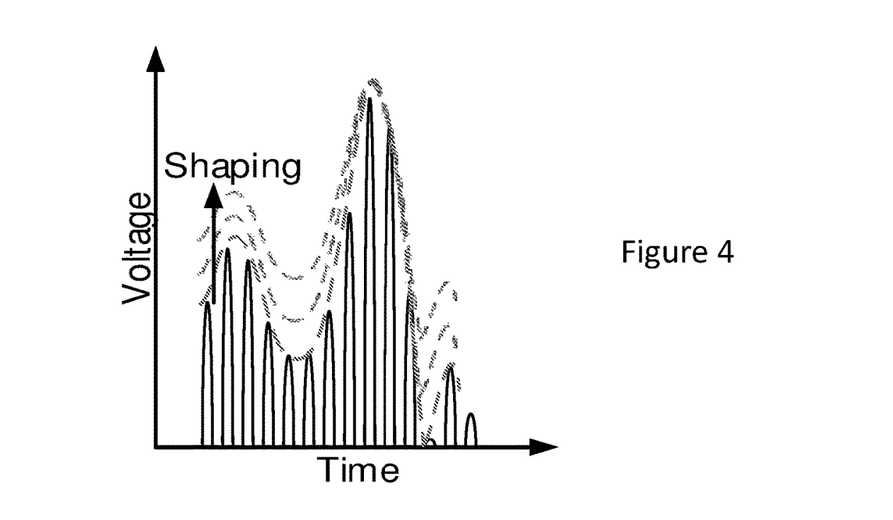
FIG. 4 shows different levels of envelope shaping.

FIG. 4 shows different levels of envelope shaping. It will be observed in FIG. 4 that as more shaping is applied, $V_{env}$ does not track $V_{out}$ into the nulls. Any misalignment experienced in the nulls leads to distortion as shown in FIG. 2. Therefore, increasing the envelope shaping reduces the amount of distortion.

Where a high timing alignment accuracy is required on a nanosecond basis, a high sampling rate is required both for the digital baseband and also in digital to analogue converters used in the envelope tracking. This is problematic since power consumption scales with sample rates. Generally, the timing alignment is adjusted for minimum distortion. However, this is not suitable for simple low power ET implementations. The approach proposed in embodiments offers a compromise solution which is both low cost and compact.

Figure 5:
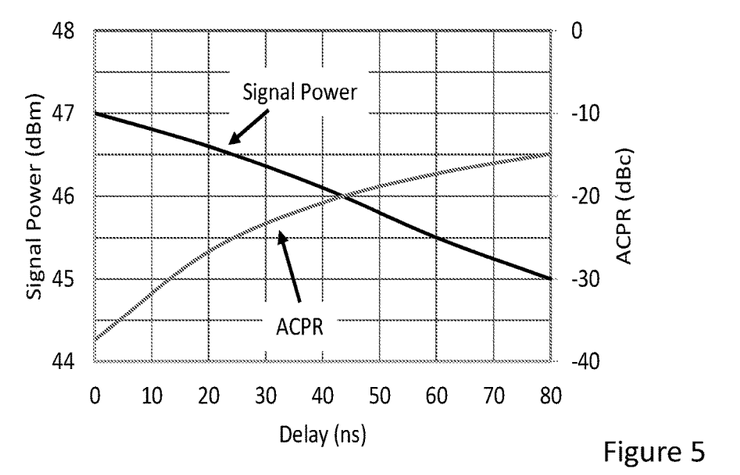
FIG. 5 shows signal power and adjacent channel power ratio (ACPR) against relative delay between the envelope and radiofrequency paths without envelope shaping.

FIG. 5 shows signal power and adjacent channel power ratio (ACPR) against relative delay between the envelope and radiofrequency paths without envelope shaping. As shown in FIG. 5, the signal power decreases approximately in a straight line from 47 dBm for no delay to 45 dBm for a delay of 80 ns. The ACPR increases rapidly with delay from 0 ns to 40 ns. Without envelope shaping, ACPR can be reduced by aligning $V_{env}$ and $V_{RF}$, but the alignment tolerance is very small as shown in FIG. 5. For example, if the ACPR limit is −35 dBc, the tolerance is 4 ns.

Figure 6:
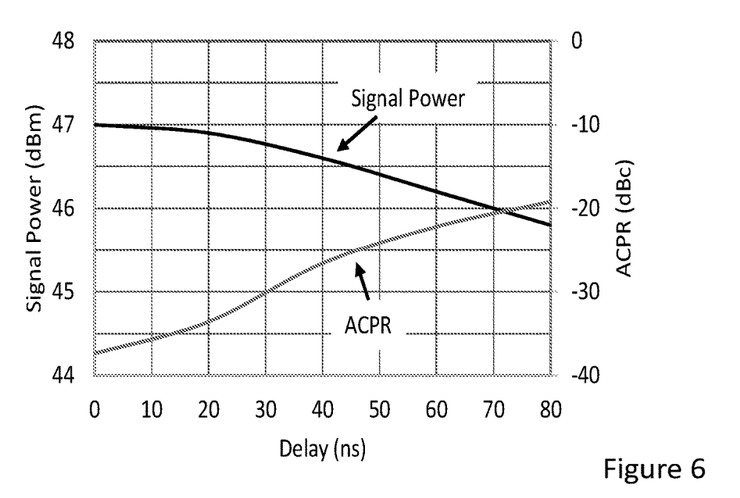
FIG. 6 shows signal power and adjacent channel power ratio (ACPR) against relative delay between the envelope and radiofrequency paths in an embodiment with envelope shaping.

FIG. 6 shows signal power and adjacent channel power ratio (ACPR) against relative delay between the envelope and radiofrequency paths in an embodiment with envelope shaping. Comparing FIG. 5 and FIG. 6, it can be seen that the signal power decrease at a lower rate with respect to delay and there is little increase in ACPR for delays of less than 20 ns. As shown in FIG. 6, if ES is applied the tolerance increases to 14 ns. It is also noted from FIG. 5 and FIG. 6 that as delay between the paths increases the signal power (i.e. the transmitted signal) decreases. ES helps to maintain the signal power. This corresponds to dropping the sample rate from 250 MSps to 70 MSps.

Figure 7:
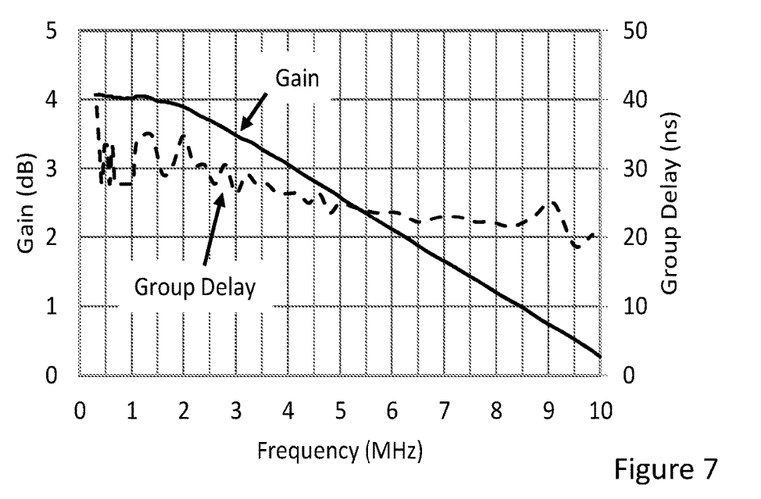
FIG. 7 shows the frequency response of a modulator used in a transmitter according to an embodiment.

FIG. 7 shows the frequency response of a modulator used in a transmitter according to an embodiment. FIG. 7 shows the measured response of a typical envelope modulator. As shown in FIG. 7, the gain decreases with frequency for frequencies above 2 MHz. It is likely that group delay of the modulator will not be flat over the bandwidth of the envelope signal. The modulator experiences group delay ripple in its pass band due to finite frequency response. Group delay ripple results in the different optimum time alignments for different frequency components of the envelope signal.

Therefore an additional advantage of embodiments is that the transmitter is less sensitive to envelope modulator frequency response.

Figure 8:
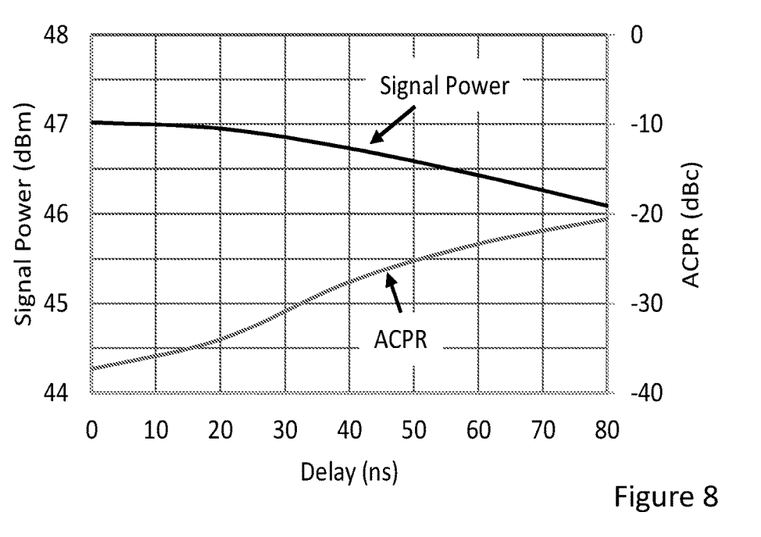
FIG. 8 shows signal power and adjacent channel power ratio (ACPR) against relative delay between the envelope and radiofrequency paths in an embodiment with envelope shaping taking into account the frequency response shown in FIG. 7.

FIG. 8 shows signal power and adjacent channel power ratio (ACPR) against relative delay between the envelope and radiofrequency paths in an embodiment with envelope shaping taking into account the frequency response shown in FIG. 7. As shown in FIG. 8, even when the modulator has a finite bandwidth and non-flat group delay, the ACPR is unaffected. This verifies that 20 ns group delay ripple present in FIG. 7 does not degrade the ACPR when ES is used.

In embodiments, the ES function is applied in the digital baseband where the ES is generated.

Figure 9:
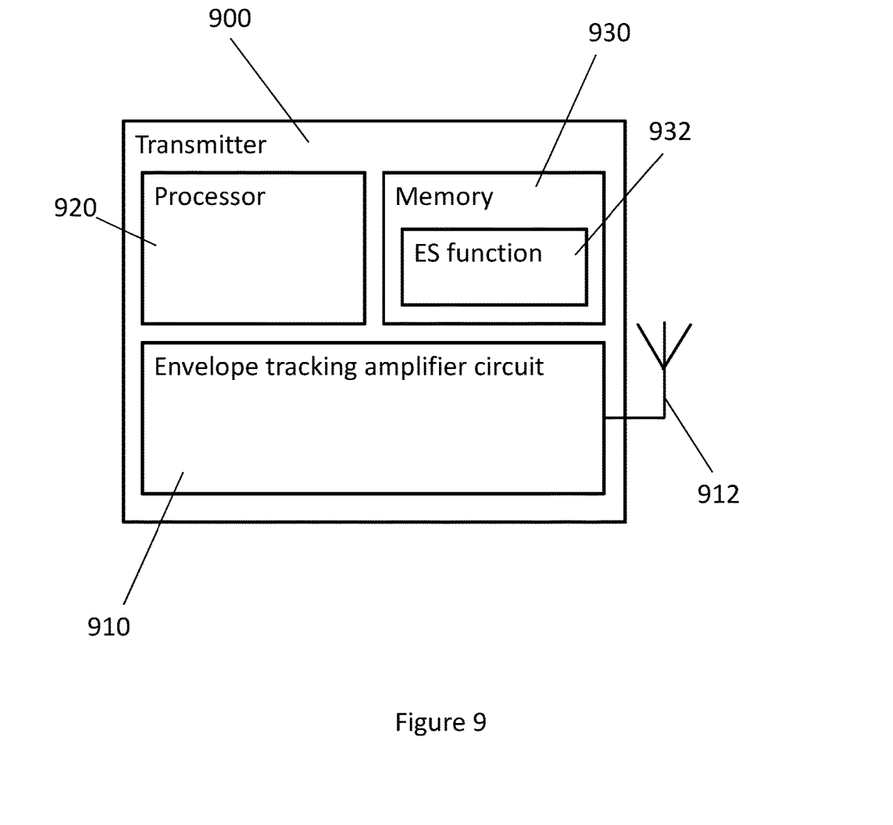
FIG. 9 shows a transmitter according to an embodiment.

FIG. 9 shows a transmitter according to an embodiment. The transmitter 900 may be for example, a handset, a base station, a television transmitter, or a Wi-Fi (for example IEEE801.11ax) access point or router. The transmitter 900 comprises an envelope tracking amplifier circuit 910 such as the embodiment shown in FIG. 1, a processor 920 and a memory 930 which stores an indication of an envelope shaping function 932. The memory 930 may store the envelope shaping function as a look-up table. Alternatively, the memory 930 may store an indication of parameters to be used by the processor 920 to calculate the envelope shaping function in real time. The transmitter further comprises an antenna 912 which is coupled to the output of the envelope tracking amplifier circuit 910. The envelope tracking amplifier circuit 910 uses the envelope shaping function indicated by the indication 932 stored in the memory to shape the envelope signal when amplifying an input signal for transmission from the antenna 912. The processor 920 is operable to execute a method of selecting the envelope shaping function 932 to reduce the sensitivity of the transmitter 900 to timing misalignment between the RF and envelope paths of the envelope tracking amplifier circuit 910.

Figure 10:
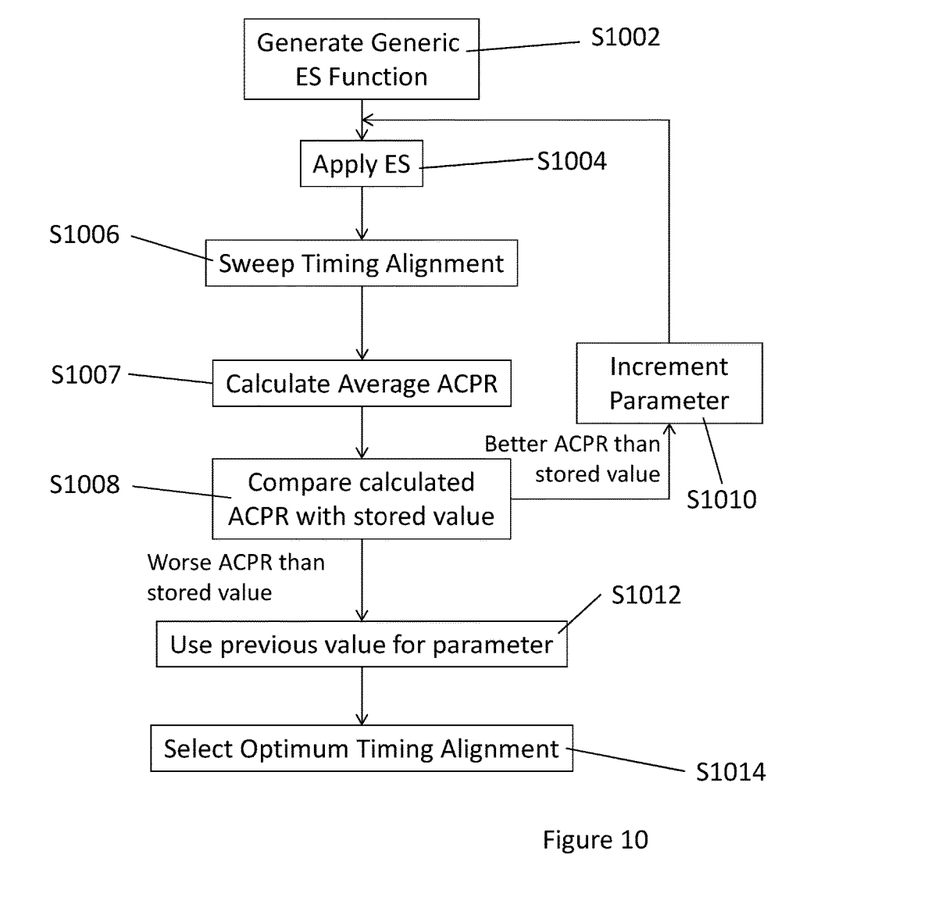
FIG. 10 is a flowchart showing a method of determining an envelope shaping function according to an embodiment.

FIG. 10 is a flowchart showing a method of determining an envelope shaping function according to an embodiment. In the algorithm shown in FIG. 10, the ES function is not based on the PA's static measurements, but arbitrarily chosen based on a set of rules, and then iterated as the delay between the paths is swept.

In step S1002, a generic envelope shaping function is generated. The generic envelope shaping function has at least one parameter that can be varied. In step S1004, the envelope shaping function applied with an initial value for the variable parameter. A test signal is applied to the envelope tracking amplifier circuit. The time delay is swept through different values in step S1006. The sweeping of the time delay is a discrete operation. The time delay is swept through discrete steps. For example if the sampling rate is 125 MSps, the time delay is adjusted in 8 ns ($\frac{1}{125}$ MSps) steps. The average value of the ACPR is calculated across the sweep of timing alignments in step S1007.

In step S1008, the swept ACPT is compared with a stored value for the ACPR from a previous iteration. Initially the stored value for the ACPR is set to zero so in the first iteration, the calculated value will be better than the stored value If the ACPR is better than the previous value, the new value is stored and the method continues to step S1010 in which the value of the parameter is incremented. For example, the ES function could be $V_{env}=a.|I+Q|^b+c$, where a and c are defined by the design and then b is incremented from 0 until the optimum value is found. By comparing a number of sweeps, the low ACPR region shown in FIG. 6 can be extended.

In the example above, the algorithm incrementes b. Other algorithms can be used, for example decrementing b, randomly choosing b or starting from the previous value.

In this description a low value for the ACPR is considered to be a better value.

If the ACPR is not better than the previous value, the method moves to step S1012 in which the previous ES function is used and the method moves to step S1014. In step S1014, the optimum timing alignment is selected. Then the Optimum timing alignment and optimised envelope shaping function are stored in the memory. It is noted that the selection of the optimum timing alignment may have a reduced accuracy as the selection of the ES function gives robustness to timing alignment.

In embodiments, the test signal has characteristics similar to that actual transmitted signal. For example, if the application is LTE, then an LTE test signal is used. This is the assumed case, although other test signals are available. The test signal may have similar characteristics to LTE, but are but be simpler to generate and monitor than real LTE signals.

In the example given above, the envelope shaping function is $V_{env}=a.|I+Q|^b+C$. Other possible functions are envisaged. For example $V_{env}=a.|I+Q|^b+d.|I+Q|^e+c$. An alternative is IF($|I+Q|>c$), then $V_{env}=|I+Q|$, else $V_{env}=c$.

The method shown in FIG. 10 may be implemented as a calibration routine run in production and then may be on an occasional basis, for example a monthly basis. The iterated ES would then be stored in memory and applied every time a transmission is done.

It is noted that applying ES can reduce efficiency. As shown in FIG. 4, a greater degree of shaping will lead to a reduced fit between $V_{env}$ and $V_{out}$. In the case where the ES allows for coarse path-alignment, the degraded amplifier efficiency can be offset by the power saving of a reduced sample rate baseband.

In the embodiment shown in FIG. 1, there delay module is in the radiofrequency path, in other embodiments, a delay module may be placed in the envelope path, or in both paths.

Embodiments provide a low cost solution to reduce the envelope tracking transmitter sensitivity to timing misalignment and possibly reduce the baseband sampling rate which will reduce overall system power consumption. Further, embodiments can be implemented into existing hardware.

While certain embodiments have been described, these embodiments have been presented by way of example only, and are not intended to limit the scope of the inventions. Indeed the novel circuits described herein may be embodied in a variety of other forms; furthermore, various omissions, substitutions and changes in the form of methods and apparatus described herein may be made without departing from the spirit of the inventions. The accompanying claims and their equivalents are intended to cover such forms of modifications as would fall within the scope and spirit of the inventions.

The invention claimed is:

1. A transmitter comprising an envelope tracking amplifier circuit comprising:
   a power amplifier;
   a radiofrequency path configured to couple a radiofrequency component of an input signal to an input of the power amplifier;
   an envelope path configured to modulate a supply voltage of the power amplifier with an envelope signal, the envelope path comprising an envelope shaping module configured to shape an envelope of the input signal using an envelope shaping function to obtain the envelope signal; and
   a delay block configured to vary the relative timing alignment of the radiofrequency path and the envelope path; storage for an indication of the envelope shaping function to be used by the envelope shaping module; and a processor operable to,
      iteratively search for a value of a first parameter of a generic envelope shaping function, by
         applying a test signal to the envelope tracking amplifier circuit and controlling the delay block over a sweep of the relative timing alignments between the radiofrequency path and the envelope path;
         determining an average measure of distortion of output of the envelope tracking amplifier circuit for the sweep of relative timing alignments;

comparing the average measure of distortion of output of the envelope tracking amplifier circuit with an average measure of distortion of the output of the envelope tracking amplifier circuit for a previous iteration; and selecting for the envelope shaping function the value of the first parameter from the previous iteration if the average measure of distortion of the output of the envelope tracking amplifier circuit for the previous iteration is lower than the average measure of distortion of the output of the envelope tracking amplifier circuit determined; and storing an indication of the envelope shaping function with the selected value for the first parameter in the storage, wherein the measure of distortion is an adjacent channel power ratio.

2. A transmitter according to claim 1, wherein the processor is further operable to determine an optimum timing alignment between the radiofrequency path and the envelope path and to store the optimum timing alignment in the memory.

3. A transmitter according to claim 1, wherein the processor is further operable to optimise the value of a second parameter.

4. A transmitter according to claim 1, wherein the processor is further operable to select the envelope shaping function based on efficiency and/or linearity.

5. A method of optimising an envelope shaping function for an envelope tracking amplifier circuit, the envelope tracking amplifier circuit comprising a power amplifier; a radiofrequency path configured to couple a radiofrequency component of an input signal to an input of the power amplifier; an envelope path comprising an envelope shaping module configured to shape an envelope signal of the input signal according to the envelope shaping function, the envelope path being configured to modify a supply voltage of the power amplifier depending on the shaped envelope signal, and a delay block configured to vary the relative timing alignment of the radiofrequency path and the envelope path, the method comprising:

iteratively searching for a value of a first parameter of a generic envelope shaping function, by applying a test signal to the envelope tracking amplifier circuit and controlling the delay block over a sweep of the relative timing alignments between the radiofrequency path and the envelope path;

determining an average measure of distortion of output of the envelope tracking amplifier circuit for the sweep of relative timing alignments;

comparing the average measure of distortion of output of the envelope tracking amplifier circuit with an average measure of distortion of the output of the envelope tracking amplifier circuit for a previous iteration; and selecting for the envelope shaping function the value of the first parameter from the previous iteration if the average measure of distortion of the output of the envelope tracking amplifier circuit for the previous iteration is lower than the determined average measure of distortion of the output of the envelope tracking amplifier circuit, wherein the measure of distortion is an adjacent channel power ratio.

6. A method according to claim 5, further comprising determining an optimum timing alignment between the radiofrequency path and the envelope path and to store the optimum timing alignment in the memory.

7. A method according to claim 5, further comprising optimising the value of a second parameter.

8. A method according to claim 5, further comprising selecting the envelope shaping function based on efficiency and/or linearity.

* * * * *